United States Patent [19]

Mukherjee

[11] Patent Number: 4,853,696

[45] Date of Patent: Aug. 1, 1989

[54] CODE CONVERTER FOR DATA COMPRESSION/DECOMPRESSION

[75] Inventor: Amar Mukherjee, Maitland, Fla.

[73] Assignee: University of Central Florida, Orlando, Fla.

[21] Appl. No.: 38,039

[22] Filed: Apr. 13, 1987

[51] Int. Cl.⁴ ............................................. H03M 7/40
[52] U.S. Cl. ........................................ 341/65; 341/67; 364/514; 382/56
[58] Field of Search .............. 340/347 DD, 146.2; 235/154; 360/39, 40; 341/56, 63, 67, 88, 59, 64, 65; 358/13, 135, 133; 364/514; 382/56

[56] References Cited

U.S. PATENT DOCUMENTS

| | | | |
|---|---|---|---|
| 3,810,154 | 5/1974 | Briant | 340/347 DD |
| 3,835,467 | 9/1974 | Woodrum | 340/347 DD |
| 3,918,047 | 11/1975 | Denes | 340/347 DD |
| 4,115,768 | 9/1978 | Eggenberger | 340/347 DD |
| 4,302,775 | 11/1981 | Widergren et al. | 341/61 |
| 4,376,933 | 3/1983 | Saran et al. | 341/67 |
| 4,420,771 | 12/1983 | Pirsch | 341/67 |
| 4,535,320 | 8/1985 | Weaver | 340/347 DD |

OTHER PUBLICATIONS

Lea, The Computer Journal, vol. 21, No. 1, 1978, "Text Compression With Associative Parallel Processor", pp. 45–46.
Hazboun and Bassiouni, Proc. ACM SIGMOD Int. Conf. on Management of Data, 1982, "A Multi-Group Technique for Data Compression," pp. 284–292.
Hawthorn, Proc. VLDB, 1982, "Microprocessor Assisted Tuple Assess Decompression and Assembly for Statistical Data Base Systems," pp. 223–233.
Welch, Computer, vol. 17, No. 6, 1984, "A Technique for High-Performance Data Compression", pp. 8–19.
Gonzalez-Smith and Storer, JACM, vol. 32, No. 2, Apr. 1985, "Parallel Algorithms for Data Compression", pp. 344–373.
Reghbati, H. K., Computer, Apr. 1981, "An Overview of Data Compression Techniques", pp. 71–74.
Bassiouni, M. A., IEEE Trans. on Software Engineering, vol. SE-11, No. 10, Oct. 1985, "Data Compression in Scientific and Statistical Databases", pp. 1047–1058.
"Digital Techniques-A Step-by-Step Introduction", Heathkit/Zenith Educational Systems, Spectrum Book, Prentice-Hall, 1983, pp. 259–260, 304–306.

Primary Examiner—William M. Shoop, Jr.
Assistant Examiner—Brian K. Young
Attorney, Agent, or Firm—James H. Beusse

[57] ABSTRACT

A code converter has a network of logic circuits connected in reverse binary tree fashion with logic paths between leaf nodes and a common root node. Characters are compressed from standard codes to variable-length Huffman code by pulse applying connections to the paths from a decoder. An OR-gate is connected to "1" branches of the network to deliver the output code. Characters are decompressed from Huffman to standard codes by connection of the Huffman code to control the clocked logic circuits to deliver a pulse from the root node to one of the inputs of an encoder. A feedback loop connects the root node and the path end nodes to initiate the next conversion. Alternative embodiments have decoder staging to minimize delay and parallel compressed code output.

22 Claims, 6 Drawing Sheets

CODE CONVERTER FOR DATA COMPRESSION/DECOMPRESSION

This invention relates to coding/encoding devices in general, and in particular to code converters useful in data compression/decompression for conversion between uniform length binary codes and variable length binary codes, such as Huffman-type codes.

BACKGROUND OF THE INVENTION

Many recent advances have been made in data storage and communications media. However, the explosive proliferation of information and the continuous growth of data applications are outgrowing technological advances in storage devices and communication tools. Data compression offers an attractive approach to alleviate many of the problems associated with data proliferation. Among its many benefits are reduction in data storage requirements, reduction in the cost of communication within distributed networks, reduction in the cost of backup and recovery in computer systems, increased security and efficient search operations on compressed index structure of files. In recent years, the demand for data compression and the need to develop faster and more efficient compression methods has increased considerably due to the increased usage of data compression with scientific and statistical databases, document delivery systems and communications networks.

Virtually all data compression techniques to date have been software implementations which do not meet the projected speed and performance requirements of future systems. Generally applicable hardware for use in compressing data from uniform length binary codes to variable length binary codes such as Huffman codes, are not available. Such equipment could, however, be used to good advantage throughout the design of an operating system, a file subsystem or a data base management system.

Proposals for hardware assistance for data compression have been few and of only limited application.

An early proposal for hardware for compression/decompression of text data is described in Lea, "Text Compression with Associative Parallel Processors," The Computer Journal, Vol. 21, No. 1, 1978, pp. 45–46. That scheme uses a stand-alone device comprising an associative parallel processor (APP), a character queue (buffer), access ports and switches. The APP has an associative memory array, input and output registers and a microprogram store. The compression method uses a 200 entry dictionary (i.e. look-up table) stored in the APP memory as a list of <n-gram, code> pairs for text compression of frequently occurring letter combinations, e.g. <THE, c1>, <TION, c2>, <AN, c3>. During compression, characters are loaded into the character queue and a search is initiated. If an n-gram is located, the corresponding code is generated as output; otherwise, a single character from the queue is passed to output. In either case, the appropriate number of characters is loaded into the character queue. The Lea article estimates that such a text compression device could operate at rates up to 0.64 Mbytes/second for compression and 0.91 Mbytes/second for decompression.

Another proposal, described in Hazboun and Bassiouni, "A Multi-group technique for Data Compression," Proc. ACM SIGMOD Int. Conf. on Management of Data, 1982, pp. 284–292, is a primitive design for the multi-group compression method which is designed to reduce the overhead of data transmission in distributed networks. The proposed hardware is an I/O board in a host machine, logically based on a finite state machine. It comprises a decode machine (input register, control logic, first-in-first-out (FIFO) character queue, address register and microcode memory), an encode machine (primary and alternative send registers, a FIFO character queue, transmit control logic, look-ahead logic and three flag bits) and an encode/decode memory. The heart of the finite state machine is the single instruction processor whose task is to climb through a logic tree of binary decisions. The microcode memory holds the necessary jump addresses, with one or two jump addresses being selected based on the current data bit being received.

A third proposal, given in Hawthorn, "Microprocessor Assisted Tuple Access Decompression and Assembly for Statistical Data Base Systems," Proc. VLDB, 1982, pp. 223–233, uses a microprocessor assisted system (MAS) to offload the process of data compression and attribute partitioning from the front-end machine running a statistical data base management system. The general purpose microprocessors are organized in a two level hierarchy. At the top level, there is a single (root) microprocessor which is connected to both the front-end machine and to the leaf microprocessors (at the second level of the hierarchy). Each disk in the system is connected to a leaf microprocessor. Hawthorn estimated that at least 1300 instructions would be executed by a microprocessor for compression of a 2 Kbyte page. Thus, at an execution speed of 1 microinstruction per second, a compression rate of up to 1.57 Mbytes/second would be attainable.

In Welch, "A Technique for High-Performance Data Compression," Computer, Vol. 17, No. 6, 1984, pp. 8–19, there is a brief discussion about the Sperry hardware-design of the LZW algorithm. That design uses an 8K RAM as a hash table with a load factor of 0.5. The speed depends on the hashing system. Welch estimated that compression speeds of up to half the clock rate could be possible with a compression ratio of 50% and short hash lengths.

In Gonzalez-Smith and Storer, "Parallel Algorithms for Data Compression," JACM, Vol. 32, No. 2, April 1985, pp. 344–373, there is a proposal for the implementation of compression by textual substitution, using systolic arrays. Both static and sliding dictionary models are considered. In the static dictionary case, for example, the basic element of the systolic structure is a pipe with three processing components, each pipe corresponding to a string in the dictionary. The overall structure is in the form of three parallel rows of elements, with dictionary strings being stored in the middle row. No estimate was given for the size of the dictionary that could be placed on a single chip.

SUMMARY OF THE INVENTION

The present invention provides code conversion apparatus for converting binary signal representations of characters from a first coding scheme to a second variable-length coding scheme, and vice versa. The apparatus utilizes a plurality of logic circuit elements or nodes connected in reverse binary tree-like fashion to form a plurality of logic paths extending between a common "root" node and individual "leaf" nodes corresponding to the separate characters. Means provided for clocking the logic elements or nodes along the different paths results in conversion between one form of coding and another for the same character.

The code converter of the present invention has the advantage over the described conventional code conversion techniques in that it eliminates, or at least significantly reduces, the requirement for storage (code-decode look-up tables) or microcoding. This results in faster processing rates independent of the memory or machine cycle of the backend or the host processor. The invention enables data compression/decompression in general applications at greatly increased speeds that far exceed the maximum data flow rate of current and immediately foreseeable disk technology.

Another advantage of the inventive approach over the existing approaches is the ease and efficiency with which the developed algorithms can be implemented in microchip form using LSI or VLSI solid state technology.

In preferred embodiments of the invention, described in greater detail below, the logic circuit nodes are implemented using simple logic cells that serve as building blocks to obtain the desired logic tree circuitry. This allows communications between cells by means of localized interconnection wirings, a feature essential for good VLSI implementation.

Code converters are disclosed for both data compression and decompression. In one aspect of the invention, a compression module has input circuitry in the form of a decoder for delivering a pulse to one of a plurality of output terminals, each corresponding to a particular character. The terminals are connected to respective ends of the logic circuit paths and propagation of the pulse toward the common root node along the corresponding path generates the compressed code for the character. A serial bit embodiment of compression module produces the code by unique connections of each path to the input of an OR-gate. A parallel bit embodiment has equal numbers of logic circuits along each path and means for simultaneously delivering the output of each step in the propagation of the pulse through the logic tree and thereafter validating the output. In another aspect, a decompression module has the paths of the logic tree connected to the terminals of an encoder. Means is provided selectively sequentially clocking the logic circuits along the logic tree paths in accordance with the compressed code representation of a character, so that a signal pulse starting at the common root node is caused to propagate through the tree to energize a unique one of the encoder terminals, which then produces the equivalent standard decompressed code. Feedback connections to the root node are provided to start a new conversion operation as soon as an old one is finished.

BRIEF DESCRIPTION OF THE DRAWINGS

Embodiments of the invention have been chosen for purposes of illustration and description, and are shown in the accompanying drawings, wherein.

Throughout the drawings, like elements are referred to by like numerals.

DESCRIPTION OF PREFERRED EMBODIMENTS

The code converter hardware of the present invention has general applicability to the conversion of any uniform length binary code to any nonuniform length binary code, or even the conversion of any nonuniform length code to any nonuniform length code. However, for illustrative purposes and in keeping with a primary objective of providing useful hardware for data compression/decompression, implementation will be discussed in terms of an application to conversion of a standard binary coded decimal (BCD) code to a code of the type such as described in Huffman, "A Method for the Construction of Minimum Redundancy Codes," Proc. IRE, Vol. 40, 1952, pp. 1098–1101.

Huffman's encoding method takes advantage of the distributional property that different characters do not occur with the same frequency. The most frequently occurring characters can thus be assigned the shortest codes. All longer codes are such that the shorter codes do not appear as prefixes thereof.

Consideration is given to the Huffman code appearing in Table 1, below:

TABLE 1

| Example Huffman-type Code | | |
|---|---|---|
| Character | Probability of Occurrence | Code |
| A | 0.1 | 000 |
| B | 0.1 | 0011 |
| C | 0.1 | 0010 |
| D | 0.3 | 01 |
| E | 0.1 | 101 |
| F | 0.1 | 100 |
| G | 0.2 | 11 |

It is noted that the most frequently occurring characters, D and G, have been assigned the two bit codes 01 and 11, respectively. Three and four bit codes have been assigned to the remaining characters. Neither the three nor the four bit codes begin with the two bits 01 or 11, assigned to D and G; and none of the four bit codes begin with the same bits as any of the three bit codes.

Figure 1:
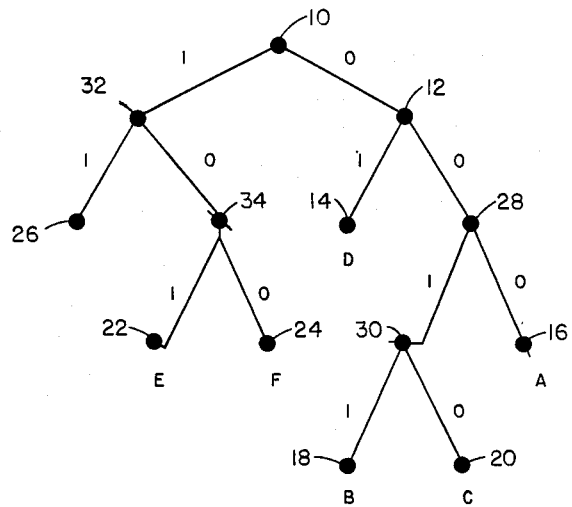
FIG. 1 is a binary tree representation of an example alphanumeric character to Huffman code conversion.

A binary tree representation of the example code given in Table 1 is shown in FIG. 1. In the binary tree representation, the code for each character can be traced by the sequence of 0's and 1's in a unique path from the root node of the tree to the leaf node representing the character. As shown in FIG. 1, the 01 code for D is seen by tracing a path from the root node 10 through node 12 to node 14, identified as the D leaf node. The codes for the characters A, B, C, E, F and G can be similarly traced along other paths from the root node 10 to the leaf nodes 16, 18, 20, 22, 24 and 26, respectively, passing through the intermediate nodes 28, 30, 32 and 34. Thus, for example, the code 000 for A is traced from root node 10 through intermediate nodes 12 and 28 to the A node 16. By laying out the binary tree for the selected coding scheme, such as the Huffman scheme of Table 1, a visual confirmation is given that a unique path is established for each character code representation and that shorter codes do not serve as prefixes for any longer code.

As a next step in developing the hardware implementation of the selected code conversion scheme, a reverse binary tree is derived for the established relationship between the characters and their respective assigned codes. A reverse binary tree is a labeled binary tree whose leaf nodes and some of the internal nodes represent the characters and for which the sequences of 0's and 1's read along the paths from the nodes representing the characters to the common root node of the tree correspond to the codes of the characters. The reverse tree corresponding to the binary tree of FIG. 1 and the coding scheme set forth in Table 1 is shown in FIG. 2.

Figure 2:
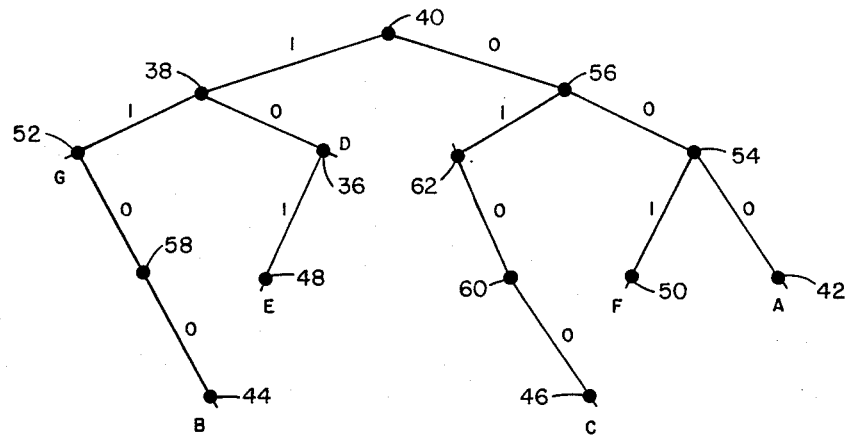
FIG. 2 is a reverse binary tree representation of the conversion scheme shown in FIG. 1.

With reference to FIG. 2, the characteristics of the reverse binary tree configuration are apparent. The code corresponding to each character, in contrast to the tree of FIG. 1, is traced in the reverse tree by beginning at the leaf node labeled by that character and then proceeding to trace the shortest path to the root node.

As shown in FIG. 2, for the example Huffman code given in FIG. 1, the code for the D character, i.e. 01, is traced by following the path from the D leaf node 36 through intermediate node 38 to the root node 40. In similar fashion, the codes of the other characters A, B, C, E, F and G can be traced from their respective leaf nodes 42, 44, 46, 48, 50 and 52, through the intermediate nodes 38, 54, 56, 58, 60 and 62 to the root node 40. For example, the A character code 000 is traced from the A leaf node 42 through intermediate nodes 54 and 56 to the root node 40. Development of the reverse binary tree establishes the basic framework upon which the hardware implementation of the code converter is built.

Figure 3:
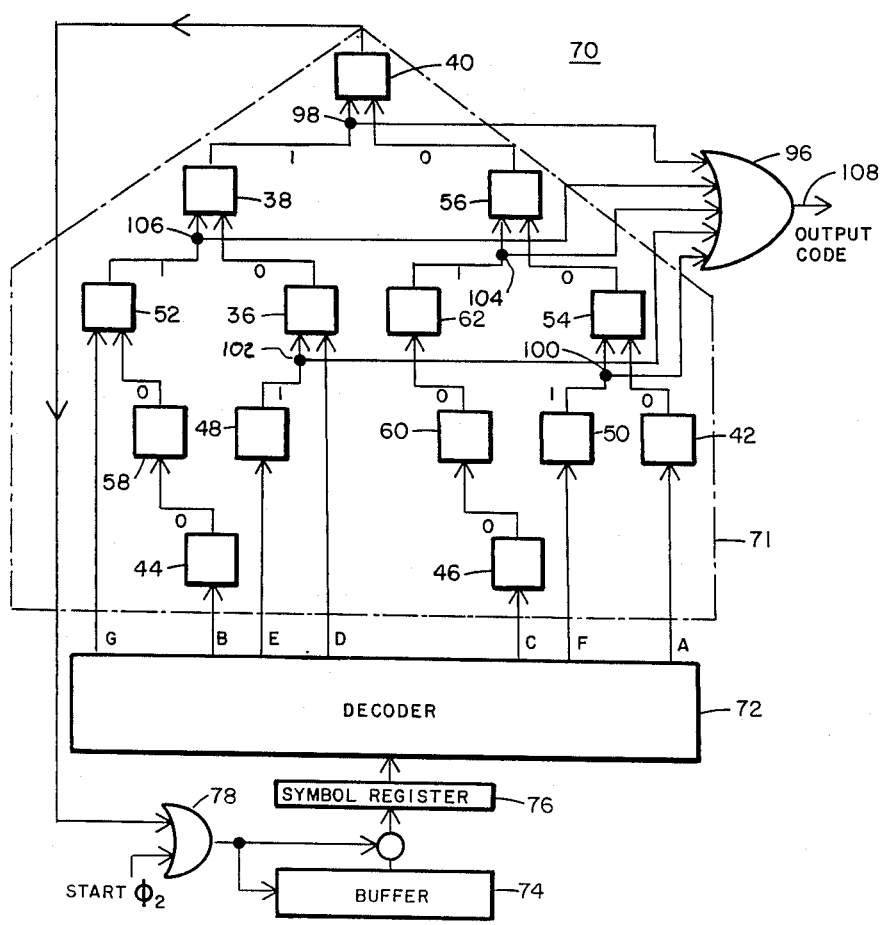
FIG. 3 is a schematic diagram of the code converter of the present invention in the form of a data compression circuit to implement the example conversion shown in FIG. 1.

Circuitry for implementing the encoding scheme for the exemplary Huffman code set forth in Table 1 is shown in FIG. 3. FIG. 3 shows a data compression module 70 for converting binary data in binary decimal coding (BCD) format into variable length Huffman code. Module 70 includes a logic network 71 (indicated in dot-and-dashed lines) that comprises a plurality of logic circuit elements 36–62, respectively corresponding to the nodes 36–62 and connected in binary tree-like fashion to form a plurality of logic circuit paths in accordance with the interconnection of the nodes 36–62 shown in the reverse binary tree of FIG. 2. For clarity of presentation the characters A–G of the starting nodes and the "0's" and "1's" along the branches of the paths of the reverse binary tree of FIG. 2, are shown in corresponding locations alongside the circuitry of FIG. 3. Each logic path extends from one of the starting node elements 42, 44, 46, 48, 50 and 52 to the element 40 which is in the common root node position.

A conventional decoder, such as a BCD decoder 72, serves to place an electronic signal "pulse" or "token" at the input to the starting node logic circuit corresponding to the leaf or intermediate node representing the character whose binary representation is to be converted. The logic circuits 36–62 operate in response to clock pulses so that the pulse or token traverses one step toward the root node circuit 40 at each clock pulse or time step, delivering a sequential output of "0" or "1" as indicated in FIG. 3 at the output of each node circuit at sequential steps along the activated path. The logic is such that when the token reaches the root node circuit 40, the sequential outputs make up the desired Huffman code for the character at whose node the token was initially placed by the decoder 72. The decoder 72 can now place another token at the node corresponding to the next character to be compressed.

At the front end of the circuitry 70, a buffer 74 is provided followed by a symbol register 76. The buffer 74 serves to temporarily store a train of data in binary signal form which is to undergo compression. An OR-gate 78 provides for transfer between the buffer 74 and the register 76 of a character or symbol string at the start of the compression operation and also each time a token has traversed the node circuit from the decoder 72 to the root node 40. As shown in FIG. 3, the output of root node 40 is connected as one input to the OR-gate 78 and a clock pulse input $\phi_2$ qualified by a "start" signal is connected as a second input to the OR-gate 78. The register 76 serves as the input register to the decoder 72.

It will be appreciated that the decoder 72 may take the form of any conventional decoding circuitry which will take the binary bit representation of a character deposited in the input register 72 and produce a corresponding signal at one of a plurality of output terminals which are connected to the corresponding character encoding path starting nodes. For the compression of standard binary coded decimal codes to Huffman coding, as illustrated here, decoder 72 is a conventional BCD decoder. It should be clear, however, that for the conversion of other coding schemes a different appropriate decoder is substituted for the decoder 72.

Figure 4:
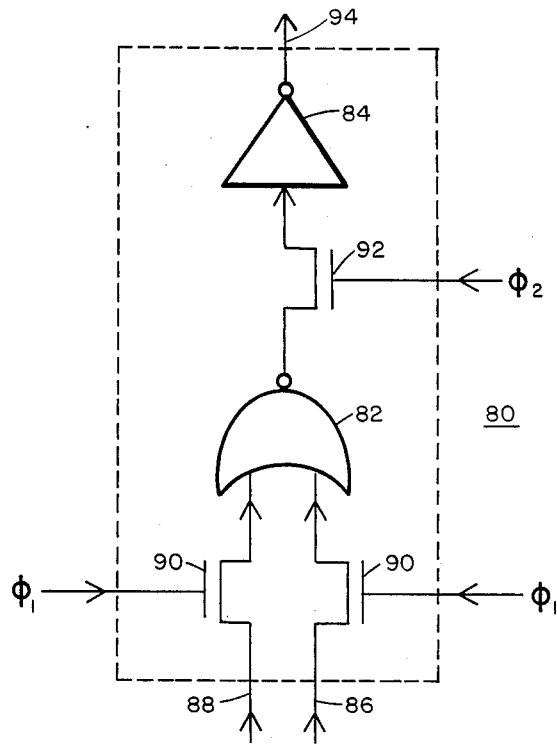
FIG. 4 is a schematic diagram of a logic cell utilizable in the code converter of FIG. 3.

The functions at each of the nodes 40–62 can be implemented in accordance with well-known techniques using any of numerous digital logic technologies. FIG. 4 shows an nMOS implementation for the two-input nodes 36, 38, 40, 52, 54 and 56, utilizing standard two-phase nonoverlapping clocking of phases $\phi_1$ and $\phi_2$.

As shown in FIG. 4, a suitable node unit logic circuit or cell 80 comprises a NOR-gate 82 connected in series with an inverter 84. The cell 80 has two inputs 86 and 88 each connected as an input to the NOR-gate 82 by means of a clocking switch, such as an nMOS field effect transistor 90, responsive to a timing signal of phase $\phi_1$. The output of the NOR-gate 82 is connected to the input of the inverter 84 through a clocking switch, such as an nMOS field effect transistor 92, which is responsive to a timing signal of phase $\phi_2$. The output 94 of the inverter 84 serves as the output of the node logic circuit unit 80. The circuit unit 80 is connected in the compression module 70 (FIG. 3) as, for example, for node 36, wherein the input 86 of the unit circuit 80 is connected to the D character output terminal of the decoder 72, the input 88 is connected to the output of the node circuit 48 and the output 94 is connected as one of the inputs to the node circuit 38. Other node circuit elements are similarly connected. It is observed with reference to FIGS. 2 and 3 that the tree structure shown in FIG. 2 is implemented in one-to-one correspondence in the node circuit structure 71 of the module 70.

The node circuits 42, 44, 46, 48, 50, 58, 60 and 62 which have only one input can be implemented by replacing the two-input NOR-gate in the logic cell of FIG. 4 by an inverter or by using the unit of FIG. 4 with one of the two inputs to the NOR-gate being grounded (set to constant "0").

The compressed data output encoded into Huffman code by the compression module circuit 70 is taken in serial form from the node circuit network 71 by means of a plurality of input connections to an OR-gate 96 (FIG. 3). The OR-gate 96 has inputs 98, 100, 102, 104 and 106 connected to branches of the tree that correspond to 1's in the reverse binary tree of FIG. 2. Thus, for the exemplary Huffman code of Table 1, inputs 98, 100, 102, 104 and 106 to the OR-gate 96 come from outputs of the node circuits 38, 50, 48, 62 and 52, respectively.

In operation, the serial compression module 70 receives input characters in BCD or other specified binary input form from input buffer 74. The size of buffer 74 depends on the encoding scheme to be compressed and on the average number of such characters or symbols to be received per unit of time. It is suitable for the size of the buffer to equal the maximum length of the path in the binary tree 71. At the start of the compression operation and at the conclusion of the compression of each character, a new character or symbol is latched into the symbol register 76 for input to the decoder 72. Decoder 72 decodes the signal received at register 76 and sends a signal or token to its appropriate output terminal A-G, as input to the path of the node logic network 71 that corresponds to the generation of the Huffman code for that character. The token traverses up to the root node 40 in response to sequential two-phase clocking, generating the compressed Huffman equivalent output code one bit at a time, as it moves up the path. The process is then repeated for the next symbol.

A byte corresponding to the letter D latched at the symbol register 76 will, for example, produce a "1" at the output terminal D of the decoder 72. This will serve as an input to the node circuit 36 whose output at the first clock pulse will be "1". The "1" output of the element 36 will then be set as an input to the node circuit 38, whose first clock pulse output will be "0" and whose second clock pulse output will thus be "1". Therefore, the input 98 to the OR-gate 96 will first be a "0" and then "1". Because the decoder 72 has placed a "1" only on the output terminal D (with output terminals A, B, C, E, F and G being "0") the inputs 100, 102, 104 and 106 to the OR-gate 96 will be "0" at both the first and second clock pulses. The output code generated at the output 108 of the OR-gate 96 (and, thus, the output of module 70) will be a "0" followed by a "1". This is the compressed code for the letter D set forth in Table 1.

The third clock pulse will generate a "1" at the output of the root node circuit 40 which is connected as an input to the OR-gate 78. When this occurs, the next character will be advanced for decoding. In this way, variable length output codes can be generated sequentially without delay even though the input characters are the same length. Because the logic for a stage of the tree 71 is simply a shift register stage, the maximum compression rate will be determined by the speed of propagation of the token up the tree. With current technology, this could be in the range of 20-40 Mhz. Thus, an average length of the code word of 4 bits (compression ratio of 50%) will yield a compression rate of 5 to 10 million characters/second. This represents compression rates far exceeding the currently achievable encoding rates in software, or the rates that can be obtained by previously proposed hardware schemes (about 1 to 2 million characters/second).

It should be noted that the critical delay which determines the clock speed is the delay within the decoder 72. To minimize this delay, the decoder 72 can be broken into a pipeline with the number of stages in the pipe equal to the minimal path depth in the reverse binary tree 71. The decoding of a new symbol can proceed in parallel with the traversal of the token (the result of decoding the previous symbol) up the tree 71. If the token traverses a path whose length is larger that the minimal depth in the tree 71, the decoder 72 output can be stored in latches within the decoder 72 and delivered to the beginning node of the logic path of tree 71, in coincidence with the emergence of the token from the root node 40. This will improve the average speed of operation of the decoder 72 since the minimum path length corresponds to the most frequently occurring characters.

Figure 5:
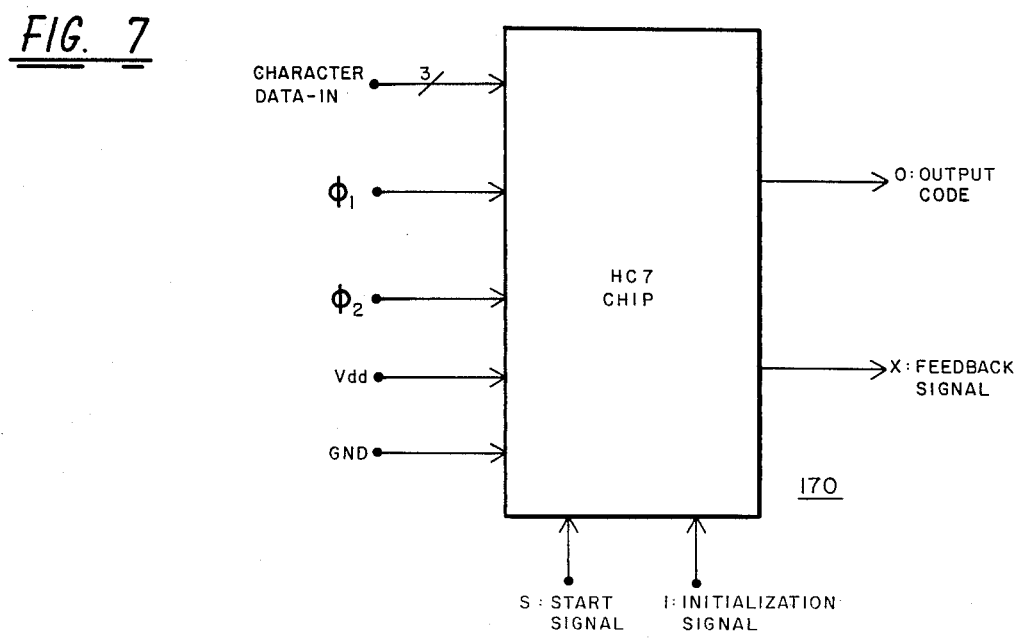
FIG. 5 is a chip terminal diagram of a modified form of the code converter of FIG. 3.

A modified implementation of the circuit of FIG. 3 is shown in FIGS. 5-14 by an example Huffman compressor chip HC7 which has serially delivered output and includes the improved speed decoder staging. The implementation is in accordance with the Huffman tree of FIG. 1 for seven alphanumeric characters. FIG. 5 shows the external functional interface of the chip 170. The chip 170 has three data input lines for designating the binary input representation of one of the seven characters. An output code line O, a feedback signal line X for delivering the signal from the root of the tree, an initialization signal line I, a start signal line S, two clock output signal lines $\phi_1$ and $\phi_2$, and power (Vdd) and ground (GND) input lines.

The two major components of the chip 170 are a 3:7 decoder 172 corresponding to the decoder 72 of FIG. 3, and a logic tree 171 corresponding to the logic tree 71 of FIG. 3. To maximize the clock speed by minimizing the delay in the decoder, the decoder 172 is broken into a two-stage pipeline, two steps being the minimal path depth in the reverse binary tree 171. The decoder 172 outputs are stored into a string of seven recirculating latches 175, only one of which stores a '1' corresponding to the input symbol at any one time. As the token emerges out of the root of the tree 171, it is fed back to transfer the information waiting in the latches 175, to the starting nodes of the various logic paths of the tree 171. At the same time, the signal initiates the decoding of the next symbol taken from input buffer 74 (not included in the chip). The two-stage pipelining scheme insures that one code bit will be generated for each stage delay of the decoder 172. The decoder 172 output for the next symbol will always be ready in the latches 175, when the last bit of the current symbol has been generated. This pipelining scheme will thus double the otherwise available maximum clock rate. The same principle can be easily extended to a much more expanded Huffman tree. For example, for a design of the Huffman tree 171 for an input ASCII code, with a minimum code word depth equal to 4 bits, an 8-bit decoder would be substituted for decoder 172 which must be designed in four pipelined stages.

Another important consideration is the initialization that is required before every phase of encoding. Since the output of the root cell is used as a feedback signal, it must be low whenever a token is not passing through the root. This can be done by initially placing a "0" on every path of the tree 171 and also by inserting "0"s at the bottom of the tree 171, whenever the feedback signal is low (when the feedback signal is high, the decoded output from the latches is placed on the first nodes of the tree). If no initialization is done, the feedback signal becomes "undefined" and prevents the placing of a new token at the starting nodes or the reading of a new character in for decoding. In the implementation of FIGS. 5-14, two external input signals are provided: "I" for initialization purposes and "S" for starting an encoding phase. The start signal is used to receive the first character in the symbol register 176 so that it can be decoded.

Figure 7:
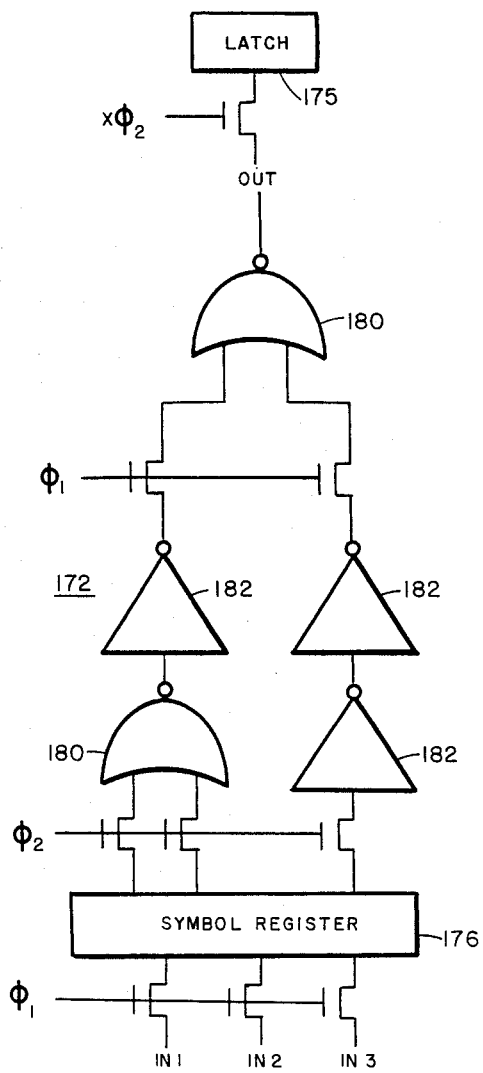
FIGS. 7-14 are schematic diagrams of logic cells utilizable in the code converter of FIGS. 5 and 6.

A suitable design for a basic decoder cell is shown in FIG. 7. During the first $\phi_1$ phase the character is loaded into the symbol register 176, and during the last $\phi_2$ phase the decoded output is captured in the recirculating latches 175. The decoding is done between these two phases by NOR-gates 180 and inverters 182 connected as shown.

Figure 8:
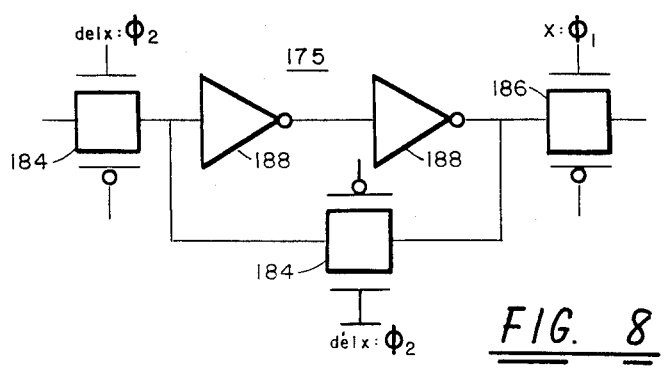
Figure 13:
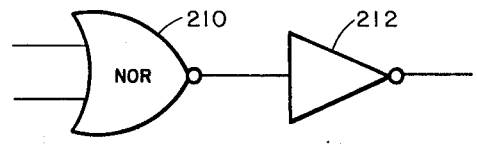

A suitable design for the basic recirculating latch cell 175 is given in FIG. 8. Seven of these cells are used to store the decoder 172, output until the previous token passes through the root and allows the latched data to be placed on the starting leaf or intermediate nodes. The cell 175 comprises gates 184, 186 and inverts 188 connected as shown. Once the feedback signal X goes high, it initiates the decoding of the next character and, since the decoding process of the example takes two cycles, the same feedback signal is delayed by two cycles (delx) and is used to activate the transmission gate that allows the decoded output to be latched into the string of latches 176. The data is refreshed through recirculation whenever new data is not being latched in.

Figure 6:
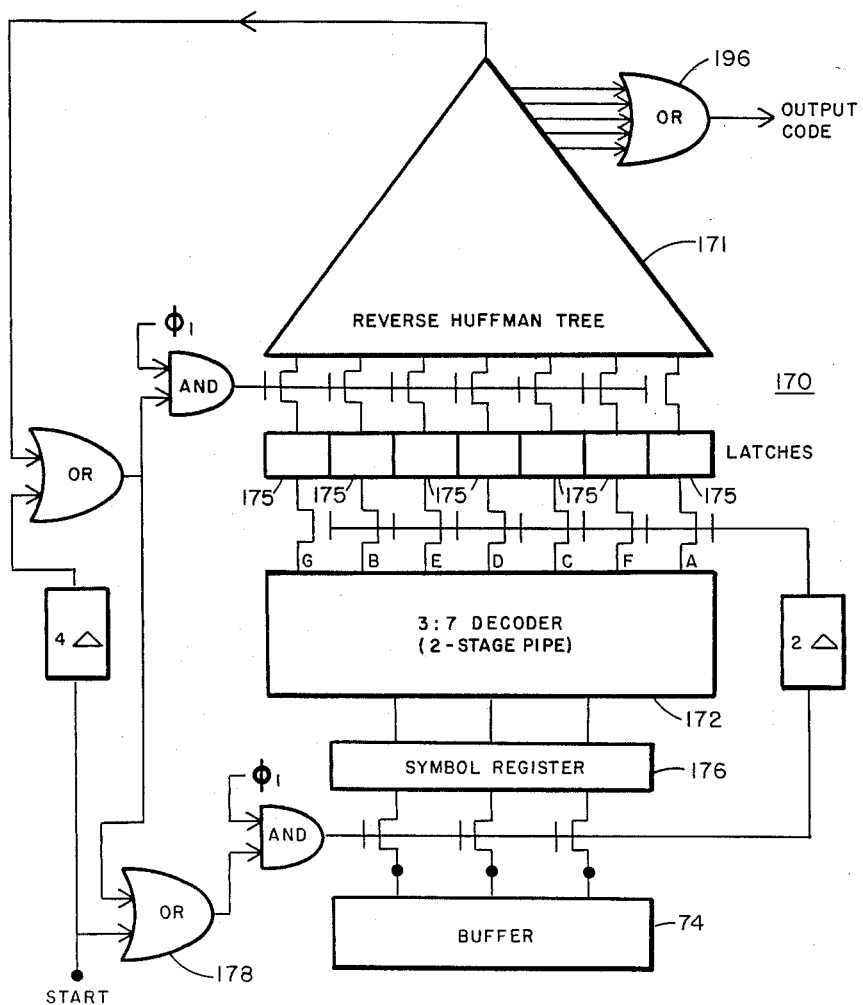
FIG. 6 is a schematic diagram of the code converter of FIG. 5.
Figure 9:
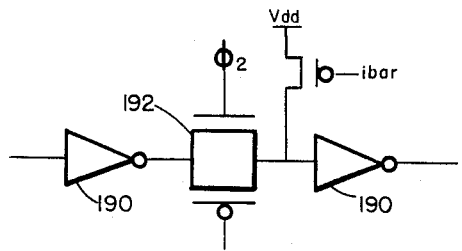
Figure 10:
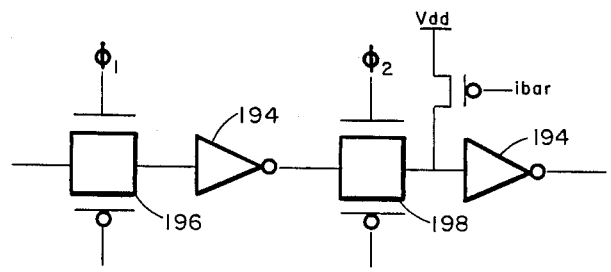
Figure 11:
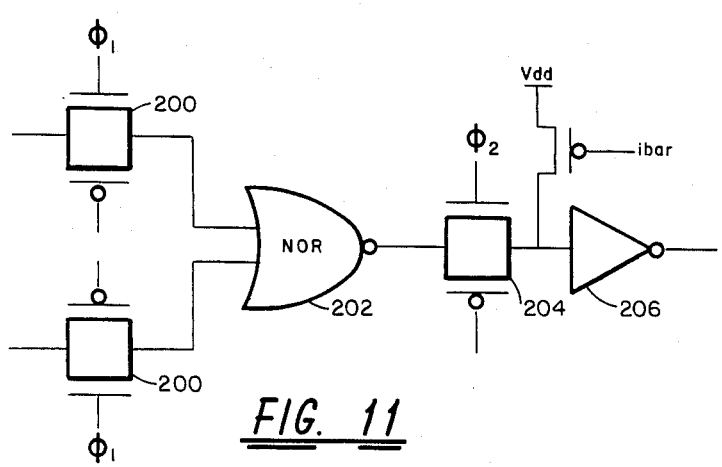
Figure 12:
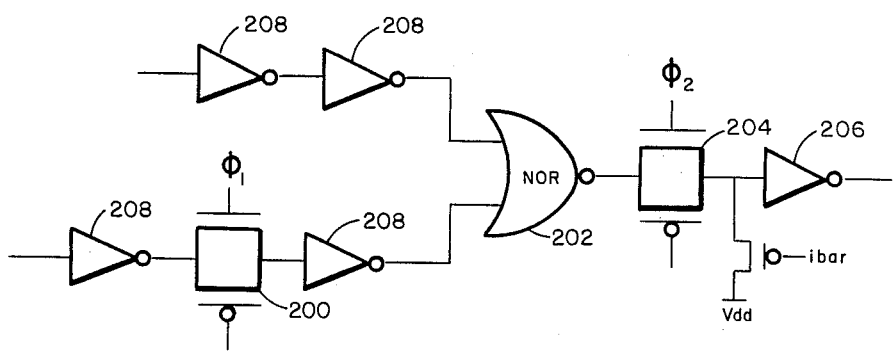

The circuit diagram for a leaf cell in the modified structure of FIG. 6 is given in FIG. 9. The input to the leaf cell comes from the recirculating latches 175 which is controlled by the feedback signal X. Each leaf cell consists of two inverters 190, separated by a transmission gate 192 controlled by the phase $\phi_2$ clock signal. Initiation is achieved through application of an "ibar" signal (inverse of initiation signal) as indicated. The modified structure 171 of FIG. 6 has three types of internal node cells which are referred to as "icells," "tcells" and "hcells." (FIGS. 10-12). The structure of the icell is given in FIG. 10 and is a shift register stage made up of inverters 194 and gates 196 and 198 connected as shown, with the "ibar" signal to force the output of the node to "0" during the initialization. The tcell is given in FIG. 11 and has two inputs applied through gates 200 that are latched by a NOR-gate 202 during the $\phi_1$ phase. The output of NOR-gate 202 is passed through transmission gate 204 and inverted by inverter 206 during the next $\phi_2$ phase, so that the overall function of the cell is the OR-ing of the inputs. The bcell is given in FIG. 12 and has a non-uniform structure, with one of the inputs going through only the $\phi_2$ phase and the other input passing through both the $\phi_1$ and $\phi_2$ phases. The logical function of the bcell circuit is the same as that of the tcell and its structure is similar, except that one transmission gate 200 is missing and inverters 208 are added. The function of the root cell, shown in FIG. 13, is to again OR its two inputs by use of serially connected NOR-gate 210 and inverter 212. The root cell (FIG. 13) has no clocks since no cycles are to be inserted in between codes. In other words, it is desirable to generate the code in a continuous fashion with one bit every clock cycle once a compression phase is started.

Figure 14:
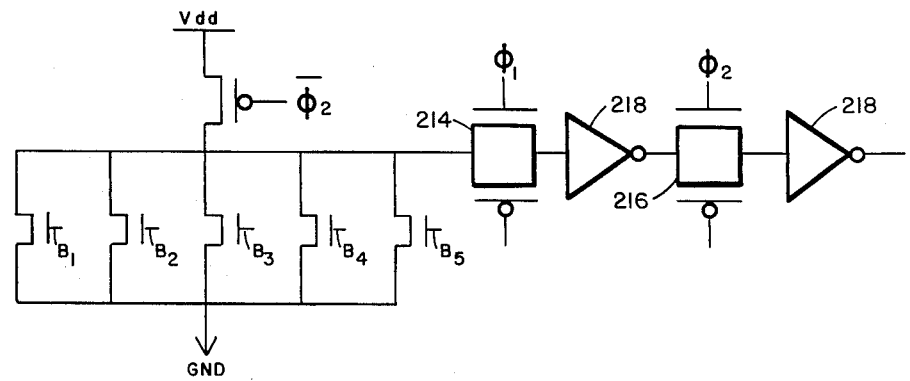

The output circuit to produce the code with one bit of encoded information every clock cycle, as given in FIG. 14, comprises gates 214 and 216 joined to serially connected inverters 218 in shift register configuration. The node circuit connections that correspond to the branches of the tree of FIG. 2 that are labeled "1" are fed to the input of the output circuit at switch connections B1-B5. The circuit generates a "0" during each clock cycle except when a token passes through one of those branches in the tree. A precharge circuit is used as shown in FIG. 14, with the output circuit input connected to ground when any of branch lines B1-B5 is energized.

Figure 15:
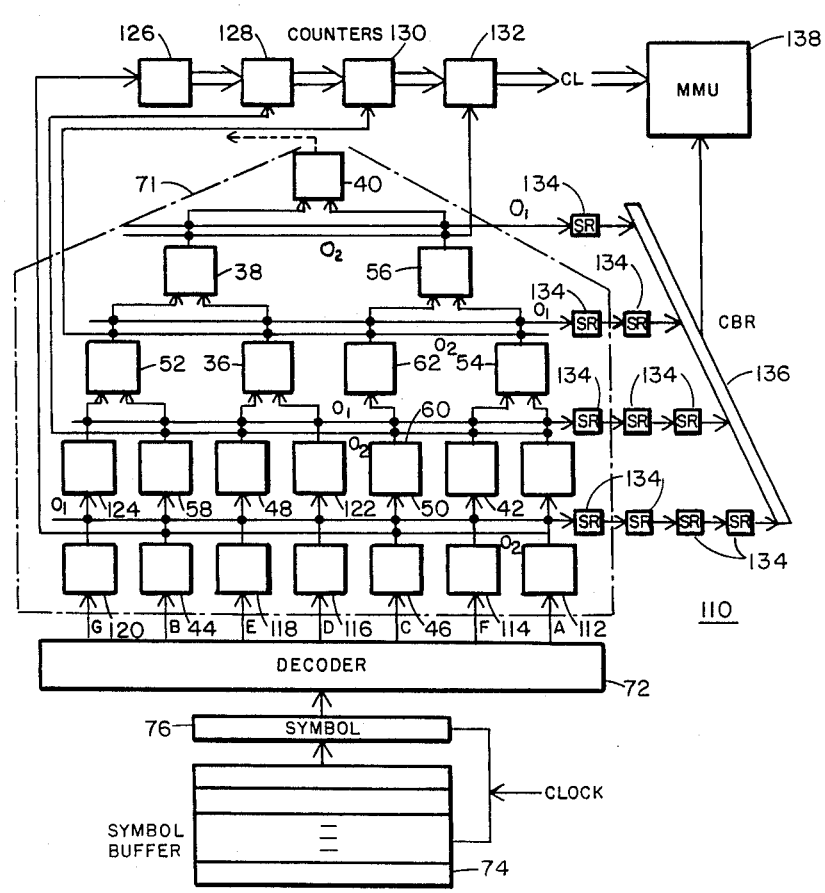
FIG. 15 is a parallel output form of the code converter of FIG. 3.

Further improvement in speed is achievable if the bits of the code word are produced in parallel, rather than in serial fashion. FIG. 15 shows a further modified embodiment 110 of the compression module 70 of FIG. 3. The module 110 provides parallel code word generation by modifying the hardware of FIG. 3 in the following respects: first, a set of "dummy" nodes 112, 114, 116, 118, 120, 122 and 124 are added so that the length of each path from leaf (output of decoder 72) to the root (circuit 40) is the same. (For ease in comparing the structure of FIG. 15 with that of FIG. 3, dummy nodes are identified by the asterisk symbol "*".) Second, the output associated with traversal of an edge due to a dummy node is recognized to be undefined. Practical implementation of this means that the output at each level has to be split into to outputs, $O_1$ and $O_2$, with the following meaning:

| Output $O_1$ | Output $O_2$ | Output |
|---|---|---|
| 0 | 1 | 0 |
| 1 | 1 | 1 |
| 1 | 0 | Undefined |
| 0 | 0 | Undefined |

Implementation of this scheme is shown schematically in FIG. 15 by junction points which connect the outputs of all elements (e.g. elements 44, 46, 112, 114, 116, 118 and 120 of the first clock step level) to deliver signals to output $O_1$, while only the connecting outputs of the non-dummy node elements (e.g. elements 44 and 46 at the first level) to deliver signals to output $O_2$. Appropriate OR-gate, diode or other means (not shown) must, of course, be provided to isolate the separate paths from each other in making the output connections.

The output $O_2$ at each level (except the root level) is connected as an input to toggle a counter associated with each level. Counter 126 associated with level 1 is toggled by the output $O_2$ of the first level of node circuit units, and counters 128, 130 and 132 are toggled by the outputs of the second, third and fourth levels of node circuits, respectively. The counters 126-132 are connected in pipelined fashioned such that at each clock pulse, the count value of the $I^{th}$ level is shifted to the counter associated with the $(I+1)^{th}$ level. The levels are numbered upwards from leaves to root; the root having the maximum level and the leaves having the level $I=1$.

The output circuitry of FIG. 3 is also modified in the module 110 of FIG. 15 by replacing the output bus of FIG. 3 with a "triangle" of delay elements, such as simple shift register stages 134. The number of shift registers 134 provided at each level is taken to ensure that the $O_1$ outputs from each level reach the same destination at the same time (i.e. in parallel). Thus, for the four level node circuit structure of the example shown in FIG. 15, the first level $O_1$ will pass through four registers 134, the second level will pass through three registers 134, the third level will pass through two registers 134 and the fourth level will pass through one register 134. The counters 126–132 function to identify the code length. The number of shift registers 134 at the first level corresponds to the number of counters (i.e. number of levels), so that the code for each symbol compressed and the length of the code (CL) are obtained in parallel at each clock cycle. The variable length output code for the input character is obtained by extracting CL number of bits from a code buffer register (CBR) 136 which is connected to receive the outputs from the last shift register 134 at each level. The extraction process can be performed, for example, by a conventional memory management unit (MMU) 138 (FIG. 15).

With the parallel processing scheme shown in FIG. 15, a code word is generated at every clock pulse (after some initial delay at startup) and, thus, a new character received at register 76 is compressed at each clock pulse. The size of the buffer 74 must accordingly be expanded to accommodate this increase in traffic. The clock speed will be determined not only by the inherent delay in each processing node, but also by the overhead delay in the MMU. The expected speed will still far exceed the maximum rates at which data can be read from current or currently contemplated high speed disks and other secondary storage devices.

Figure 16:
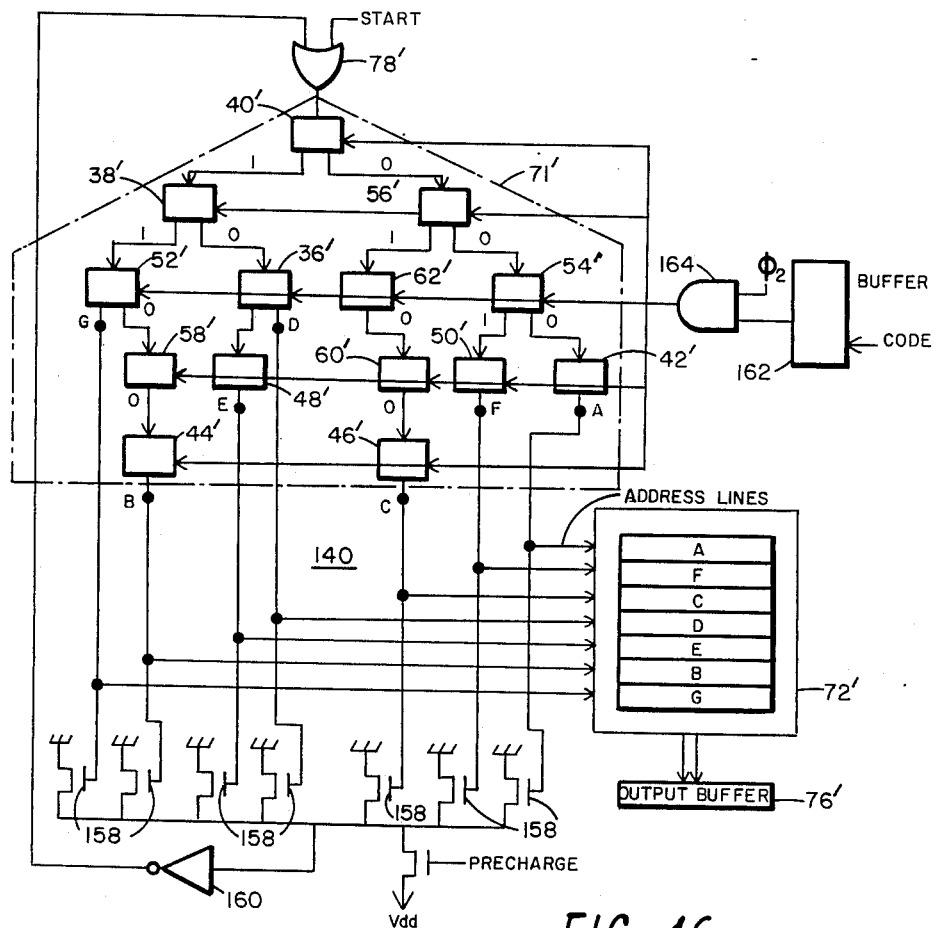
FIG. 16 is a schematic diagram of the code converter of the present invention in the form of a data decompression circuit to implement the reverse of the character to Huffman code conversion of FIG. 1.
Figure 17:
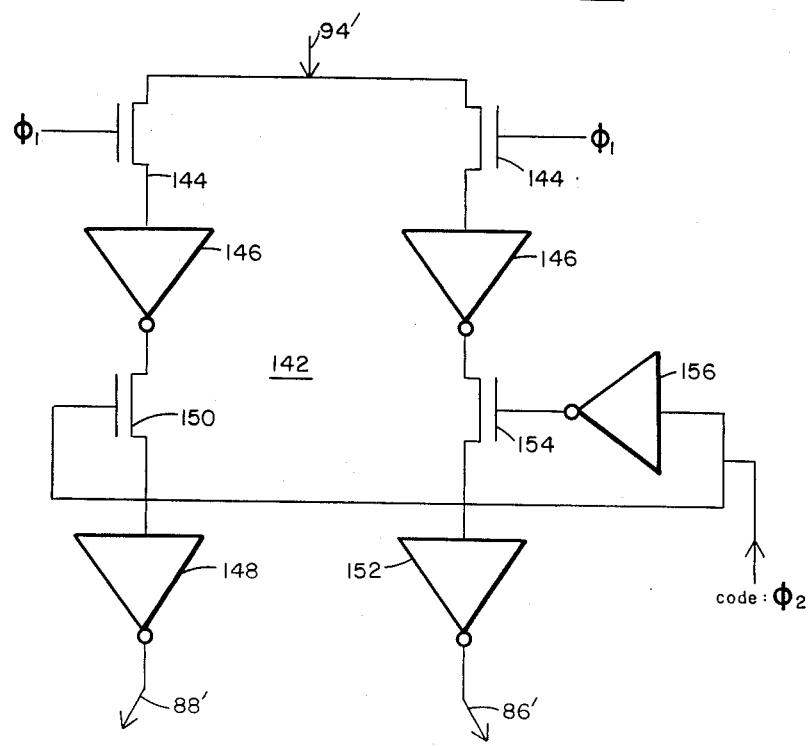
FIG. 17 is a schematic diagram of a logic cell utilizable in the code converter of FIG. 16.

Code converting hardware for implementing the code conversion from the Huffman code back to the BCD or other code is shown in FIG. 16. As shown in FIG. 16, the interconnection of the node circuit network is similarly derived from the reverse binary tree of FIG. 2, except that inputs to the node circuits 40' through 62' of the decompression module 140 now correspond to the outputs of the node circuits 40 through 62 of the compression module 70, and the outputs of the nodes of module 140 correspond to the inputs of the nodes of module 70. The decoder 72 of FIG. 3 is replaced by an encoder 72' of conventional design to perform the reverse of the function of the decoder 72. Each node of the node circuit tree is implemented by a logic unit or cell 142, such as shown in FIG. 17. The input port 94' of unit 142 is connected by means of switches 144 responsive to clock pulse signals $\phi_1$ as an input to inverters 146. The output of one inverter 146 is connected to the input of an inverter 148 by means of a switch 150 which is, responsive to the qualified clock pulse signals code·$\phi_2$. The output of the other inverter 146 is connected to the input of an inverter 152 by means of a switch 154 which is responsive to the inverse of qualified clock pulse signals code·$\phi_2$ formed by an inverter 156. The outputs of the inverters 148 and 152 are the outputs 88' and 86' of the logic circuit cell 142.

A code buffer 162 acts as a receiver of the code to be decompressed (in this example, the Huffman code), where it is latched fo each decompression cycle and summed one bit at a time in AND-gate 64 with sequential clock pulse signals $\phi_2$ to control the switches 150 and 154 of the node logic circuit cells 142.

The node circuits 42', 44', 46', 48', 50' and 52' which correspond to nodes marked by characters in the reverse binary tree of FIG. 2 are connected to a respective one of the terminals A through G of the encoder 72' and also to the gate connection of a switch 158, so that a "1" delivered at any of those node circuit outputs will connect the input of an inverter 160 to ground (i.e. low state "0"). The output of inverter 160 is connected as an input to OR-gate 78' which will deliver a "1" in response to receipt of a "0" at the input of the inverter 160. This will occur at the completion of each decoding of a Huffman code by the node tree network, and send a new pulse to the root node 40'. The OR-gate 78' is also connected to receive a "1" input at the start of the decompression phase operation.

At the beginning of the decompression operation, a "start" pulse is applied at the root 40' of the tree. This pulse traverses down the tree controlled by the sequentially applied bits of the "code" input latched in the buffer 162. If the code bit is "1", the pulse traverses the node network path portion labeled "1." If the code bit is "0", it traverses the portion labeled "0." If the pulse emerges out of a node labeled by a symbol, it initiates the encoding operation of the encoder 72' of conventional design, such as a ROM look-up table encoder. The encoder 72' creates the standard decompressed BCD or other code for subsequent usage elsewhere. The emergence of a pulse from one of the node circuits labeled by a character will ground the input to the inverter 160 to initiate the injection of the next pulse at the root 40' of the tree. The ROM access time will be the determining critical delay in the loop and will determine the speed at which code bits can be pumped into the device. With 25 nanosecond access time and 4 bits/character, the decompression rate will be in the neighborhood of 10 million characters/second.

It is thus seen, with reference to the described embodiments, that the present invention provides a code converter for use in general data compression and decompression operations that offers speeds of data compression and decompression heretofore unachievable. The apparatus made available by this invention has wide application, not only throughout the data processing industry, but also in communications, industrial process control and other industries. In the communications industry, for instance, a compression module similar to module 70 at one end of a communications link (viz. satellite link) and a decompression module similar to module 140 at the other end can result in significant reduction in transmitted time, and thus significant savings in cost.

It will be appreciated that while the examples above deal with the conversion between information coded in uniform length binary-coded decimal (BCD) and variable length Huffman-type coding, the same modules are useful for conversion of other types of coding, the interface with the former being provided by a decoder 72 or encoder 72' which can be replaced by other similar circuitry for other types of codes, such as multi-group codes, and the latter being determined by the node circuit network layout which can be restructured in accordance with other configurations for binary trees of which those shown in FIGS. 1 and 2 are just examples. Likewise, it will be appreciated that the logic circuit units used for the nodes of the node networks in modules 70, 170, 70' and 140 can be replaced by equivalent or other logic units according to individual preferences and availability. Those skilled in the technology to which the invention relates will realize that various other substitutions and modifications may be made in the examples described, without departing from the spirit and scope of the invention as described in the following claims.

I claim:

1. A code converter for converting binary signal representations of characters between representations of said character in a first coding scheme and representations of said characters in a second variable-length coding scheme, comprising:
   a logic network comprising a plurality of logic circuit elements connected together in reverse binary tree-like fashion to form a plurality of logic paths extending between an element in a common root node position and elements in other node positions which corresponds to different ones of said plurality of characters;
   input means for passing electrical signals for processing by said elements along said logic paths in accordance with a character signal representation in one of the first and second coding means, said input means comprising a decoder having an input and a plurality of output terminals, with each output terminal connected to a respective one of said elements in said other node positions;
   output means for receiving electrical signals from said logic elements along said logic paths in the form of representation of the character in the other of said first and second coding schemes, said output means comprising means for receiving output signals from said connections between elements along said logic paths that correspond to "1" branches of a reverse binary tree corresponding to said logic network; and
   a buffer for storing one of said sequence of character representations in said first coding scheme prior to conversion, and means responsive to completion of the conversion of another of said sequence of character representations for transferring said one of said sequence of character representations to said decoder input for conversion.

2. A code converter as in claim 1, wherein said output means comprises an OR-gate with its input connected to receive said "1" branch output signals.

3. A code converter as in claim 1, wherein said decoder acts to place an electronic signal pulse at an input to the element in the other node position which corresponds to the character whose binary representation is to be converted, and wherein said one character transferring means comprises means responsive to arrival of said electronic signal pulse at the output of said element in said common root node position.

4. A code converter as in claim 3, wherein said one character transferring means comprises an OR-gate connected to receive one input from said element in said common root node position and another input responsive to start of the conversion operation, and whose output is connected to control the transfer of said one of said sequence of characters from said buffer to said decoder input.

5. A code converter as in claim 1, wherein said plurality of logic circuit elements comprises a plurality of logic circuit cells, each including a NAND gate connected in series with an inverter.

6. A code converter as in claim 5, wherein an input is connected to the NAND gate by means of a clocking switch responsive to a timing signal of a first phase, and wherein the output of the NAND gate is connected as an input to the inverter through a clocking switch responsive to a timing signal of a second phase.

7. A code converter as in claim 3, wherein said decoder comprises a pipeline decoder having a plurality of stages, the number of stages being equal to the smallest number of logic circuit elements along a path between said other node positions and said root node position, not including said root node position element; and further comprising means positioned between said decoder and said logic network for latching said input means electrical signals prior to passing the same for processing, when previously passed input means electrical signals have been passed for processing along a logic path having greater than said smallest number of elements.

8. A code converter as in claim 1, for conversion from binary signal representations in said first coding scheme to binary signal representations in said second coding scheme, wherein said input means comprises a decoder having an input and a plurality of output terminals, with each output terminal connected to a respective one of said plurality of logic paths; wherein said network further comprises a plurality of dummy logic circuit elements connected to said plurality of logic circuit elements to provide an equal number of logic steps for each path from said connection to said output terminal to said element in said common root node position; and said output means comprises means for simultaneously receiving sequential output signals produced by said logic circuit elements and dummy logic circuit elements after each logic step in response to clocked progression of an electric signal pulse from one of said decoder output terminals toward the root node position along the corresponding logic path, and means for distinguishing output signals produced by said dummy logic circuit elements.

9. A code converter as in claim 8, wherein said means for simultaneously receiving sequential output signals comprises a buffer and a plurality of shift registers, said buffer having plurality of bit positions, each connected through one or more of said shift registers to receive the sequential output signal for a different logic step from said decoder output terminals to said root node position; and said means for distinguishing output signals produced by said dummy logic circuit elements comprises a plurality of serially connected counters for counting non-dummy logic circuit element output signals and a memory management unit responsive to the output of said counters for disregarding the bit positions in said buffer that correspond to dummy logic circuit element output signals.

10. A code converter as in claim 1, for conversion from binary signal representations in said second coding scheme to binary signal representations in said first coding scheme, wherein said input means comprises means for qualifying clocking of said logic circuit elements along said plurality of logic paths in accordance with the second coding scheme representation.

11. A code converter as in claim 10, wherein said input means comprises a buffer into which said code to be converted is received, and AND-gate means for applying the coincidence of sequential bits of said buffered code with a clock pulse for clocking said elements.

12. A code converter as in claim 10, wherein said output means comprises an encoder having a plurality of input terminals, each input terminal connected to the output of one of said elements in said other node positions, for producing the first coding scheme representation of the character to which said one of said other node positions corresponds, upon receipt of a signal at the connected input terminal.

13. A code converter as in claim 12, wherein said encoder comprises a ROM look-up table encoder.

14. A code converter as in claim 11, for converting a sequence of character representations in said second coding scheme to representations in said first coding scheme, further comprising means, responsive to receipt of an electrical signal at the output of a logic circuit element in one of said other node positions for initiating an electrical signal pulse at an input to said element in said common root node position.

15. A code converter as in claim 11, wherein said plurality of logic circuit elements comprises a plurality of logic circuit cells, each including a first pair of inverters connected in series by means of a clocking switch selectively activated by said code bit-clock pulse coincidence, and a second pair of inverters connected in series by means of a clocking switch selectively activated by the inverse of said code bit-clock pulse coincidence.

16. Apparatus for providing a binary code according to a variable-length coding scheme, for each of a plurality of characters, comprising:
  input circuitry having a plurality of terminals, each representing a different one of said characters, and means for selectively energizing one of said terminals;
  a plurality of logic paths, each comprising a predetermined number of clocked logic circuits and each connected at one end to a respective one of said terminals and at the other end to a common node;
  means for sequentially clocking said logic circuits; and
  means responsive to said sequential clocking, connecting each path in a unique way, for producing a sequence of binary data bits for each of said terminals energized.

17. Apparatus as in claim 16, wherein said logic paths and logic circuits are interconnected in one-to-one correspondence with the interconnections of nodes of a reverse binary tree representation of the variable-length coding scheme; and said means for producing binary data bits comprises means for receiving signals from the interconnections between said logic circuits that correspond to "1" branches of said tree representation.

18. Apparatus as in claim 17, further comprising means, connecting said common node to said input circuitry, for causing said input circuitry to energize one of said terminals in response to receipt of a signal at said common node from one of said paths.

19. Apparatus as in claim 16, wherein said input circuitry comprises a pipeline decoder having a plurality of stages, the number of stages being equal to the least number of clocked logic circuits along any one of said logic paths; and further comprising means positioned between said terminals and said logic paths for latching current selective energization of one of said terminals, when previous selective energization was of a terminal connected to a path having greater than said least number of clocked logic circuits.

20. Apparatus as in claim 16, wherein said logic paths and logic circuits are interconnected in one-to-one correspondence with the interconnections of nodes of a reverse binary tree representation of the variable-length coding scheme with additional nodes added at the leaf ends of said paths of said tree representation so that all paths have an equal number of nodes; and said means for producing binary data bits comprises means for simultaneously receiving signals from the interconnections between said logic circuits at each node step along said paths, and means for distinguishing signals received from said logic circuit interconnections corresponding to said additional nodes.

21. Apparatus for providing a different output signal for each of a plurality of binary representations of a plurality of characters according to a variable-length coding scheme, comprising:
  a plurality of output terminals;
  a plurality of logic paths, each comprising a predetermined number of clocked logic circuits and each connected at one end to a common node and at the other end to a respective one of said terminal;
  means for selectively sequentially clocking said logic circuits according to a sequence of bits in the binary code representation of one of the characters, so that a binary signal coupled to said common node propagates along said paths to energize a different one of said output terminals for each of said binary code representations.

22. Apparatus as in claim 21, further comprising means, connecting said output terminals to said common node, for causing a binary signal to be applied to said common node in response to energization of one of said output terminals.

* * * * *